United States Patent [19]
Harford

[11] Patent Number: 4,463,369
[45] Date of Patent: Jul. 31, 1984

[54] INTEGRATED CIRCUIT OVERLOAD PROTECTION DEVICE

[75] Inventor: Jack R. Harford, Raritan Township, Hunterdon Co., N.J.

[73] Assignee: RCA, New York, N.Y.

[21] Appl. No.: 273,325

[22] Filed: Jun. 15, 1981

[51] Int. Cl.³ .................. H01L 27/02; H01L 27/04
[52] U.S. Cl. ........................ 357/44; 357/46; 357/40; 357/48; 307/252 A; 307/324; 307/280
[58] Field of Search .............. 357/44, 46, 40, 48; 307/252 A, 324, 280; 330/207 P, 298

[56] References Cited

U.S. PATENT DOCUMENTS

| | | | |
|---|---|---|---|
| 3,611,067 | 4/1970 | Oberlin | 357/44 |
| 3,969,747 | 7/1976 | Tsuyuki | 357/44 |
| 3,971,060 | 7/1976 | Leuschner | 357/36 |
| 4,021,687 | 5/1977 | Yoshimura | 357/44 |
| 4,027,180 | 5/1977 | Ring | 357/44 |
| 4,118,640 | 10/1978 | Ochi et al. | 307/280 |
| 4,122,481 | 10/1978 | Horie | 357/48 |
| 4,160,988 | 7/1979 | Russell | 357/36 |
| 4,260,906 | 4/1981 | Tokumaru et al. | 357/44 |
| 4,382,195 | 5/1983 | Pohl et al. | 357/44 |
| 4,390,890 | 6/1983 | Bergeron et al. | 357/44 |

FOREIGN PATENT DOCUMENTS

| | | | |
|---|---|---|---|
| EP29538 | 11/1980 | European Pat. Off. | 357/44 |
| 1505781 | 12/1967 | France | 357/44 |
| 0646616 | 10/1962 | Italy | 357/44 |
| 56-74958 | 6/1981 | Japan | 357/48 |
| 1558281 | 7/1976 | United Kingdom. | |

OTHER PUBLICATIONS
"Conplementary Output. . . ", 104, p. 71, Jun. 22, 1964, vol. 12, No. 13, *Electronics Design*.

*Primary Examiner*—Martin H. Edlow
*Assistant Examiner*—Jerome Jackson
*Attorney, Agent, or Firm*—Birgit E. Morris; Donald S. Cohen; Lawrence P. Benjamin

[57] ABSTRACT

An integrated circuit overload protection device is used to protect a bipolar transistor used in the common emitter configuration. The protective device comprises a bipolar transistor of opposite type to the protected amplifying transistor. The protective transistor is connected with its base to the collector of the amplifying transistor and with its collector connected to the terminal of the power supply which is not connected to a terminal of the load resistor of the protected device. The emitter of the protective device is preferably connected to the base of the protected device through a protective resistor. Inputs to the protected transistor are provided at the interconnection of the emitter of the protected device with one terminal of the protective resistor.

6 Claims, 4 Drawing Figures

INTEGRATED CIRCUIT OVERLOAD PROTECTION DEVICE

BACKGROUND OF THE INVENTION

The present invention relates to an integrated circuit overload protection device.

When an integrated circuit common emitter amplifier is driven by an input signal, the polarity of the output signal is inverted relative to the input signal. Referring to FIG. 1, a schematic diagram for a common emitter amplifier circuit of the type known in the prior art, is shown. In a typical configuration, the common emitter amplifier comprises an NPN transistor Q. The collector of transistor Q is connected to the positive power supply terminal, +V, through a load resistor, $R_L$. The emitter of transistor Q is connected to ground through an emitter resistor, $R_E$. An input signal, $v_i$, is coupled to the base of transistor Q through an input resistor, $R_S$. The resulting input base current causes a collector current, equal to beta times the input base current, to flow. Consequently, the output voltage $v_o$, measured between the collector of transistor Q and ground, will be an amplified and inverted version of the input voltage, $v_i$.

The emitter voltage of a common emitter amplifier which utilizes an emitter resistor, $R_E$, tries to follow the input voltage in the so-called "emitter follower" mode. Thus, while the output signal, $v_o$, is being driven down by an increasing input signal, $v_i$, the emitter voltage is increasing. Depending upon the relative values of the circuit elements and the amount of input drive available, it is possible for Q to saturate and for there to be enough drive present for the emitter voltage to dominate the collector voltage during input peaks. Thus, while the input signal (solid line adjacent input) shown in FIG. 1 should result in the output signal (solid line adjacent output) shown, it is possible for the most negative portion of the output signal to be replaced by the portion shown in dashed line. Such result is most apt to happen under conditions in which $R_S$ is small and a large drive signal is present.

In the case of a negative feedback amplifier, in which a portion of the output signal is fed back into the input in order to help linearize the amplifier's transfer characteristics, it is possible, during an overload condition, for the amplifier to operate as a positive feedback amplifier. In video amplifiers, of the type used in television circuits, the over driving of a video amplifier preceding the automatic gain control (AGC) circuit, can result in the phenomenon known as "lock out", resulting in a garbled picture. However, it should be recognized that the problem described above is common to many common emitter amplifiers, including those used in differential and operational amplifiers. Accordingly, a protective device which would prevent this phenomenon from occuring would be highly desirable.

SUMMARY OF THE INVENTION

An integrated circuit overload protection device which prevents a negative feedback amplifier from becoming a positive feedback amplifier comprises a bipolar amplifying transistor of one type (i.e. NPN) protected by a bipolar protecting transistor of opposite type (i.e. PNP). The emitter of the protection device is connected to the base of the protected device, and the base of the protection device is connected to the collector of the protected device. The collector of the protection device is connected to the power supply terminal which is opposed to the power supply terminal to which the terminal of the load element of the protected device is connected.

DETAILED DESCRIPTION OF A PREFERRED EMBODIMENT

Figures 1, 2:
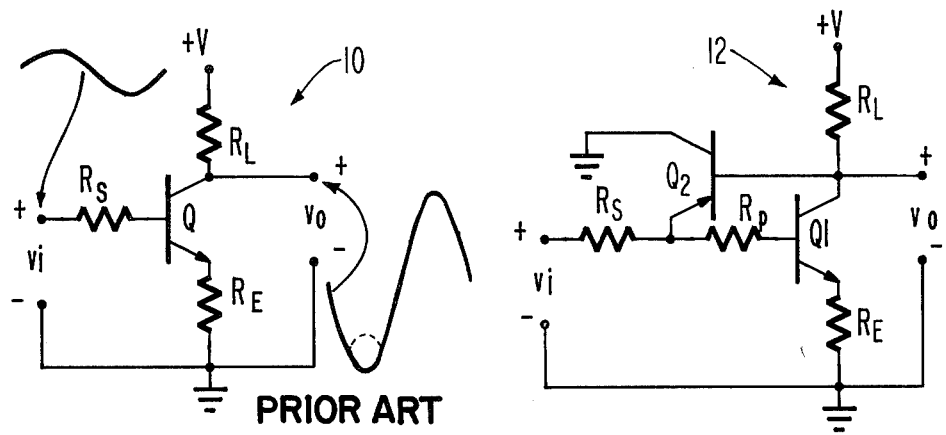
FIG. 1 is a schematic diagram of a common emitter amplifier circuit of the type known in the prior art, along with representative input and output signals.
FIG. 2 is a schematic diagram of a protected amplifier circuit which includes the protection device of the present invention.

Referring to FIG. 2, a schematic representation of an amplifier circuit 12, protected by the preferred embodiment of the present invention, is shown. The amplifier circuit 12 is comprised of an an amplifying NPN transistor Q1, connected in a standard common emitter configuration. As is well known in the art, a common emitter amplifier is often driven from a resistive source, designated by the resistors $R_S$ and $R_P$ which are used to couple an input signal, $v_i$, to the base of transistor Q1. The present invention includes a second transistor, Q2, which has its base connected to the collector of transistor Q1 and its emitter connected to the base of transistor Q1 through the protective resistor, $R_P$. The collector of transistor Q2 is connected to ground in this embodiment, because Q1, the amplifying device, is an NPN transistor and Q2, the protection device, is a PNP transistor. If Q1 had been a PNP transistor, the Q2 would be selected to be an NPN transistor, and the collector of Q2 would be connected to the positive power supply potential, +V.

In the present embodiment of the invention, the load resistor, $R_L$, is connected to the positive voltage supply terminal, +V and the collector of Q2 is connected to the opposite voltage supply terminal, namely to ground. Alternatively, had Q1 been a PNP transistor, then the collector of Q2 would be connected to the positive power supply terminal. In operation, as Q1 becomes saturated, transistor Q2 turns on and clamps the base drive signal to a potential that is just slightly above the initial saturation voltage of Q1, thereby preventing the inversion of the output signal, $v_o$. Similarly, if the transistor types were opposite to those described herein, the output of transistor Q1 would not be allowed to go any lower than the initial saturation voltage.

Figure 3:
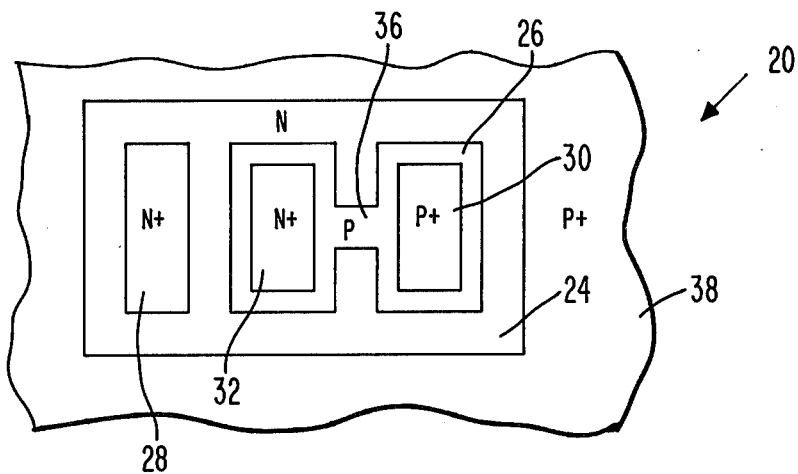
FIG. 3 is a top view of the preferred embodiment of the device of the present invention.
Figure 4:
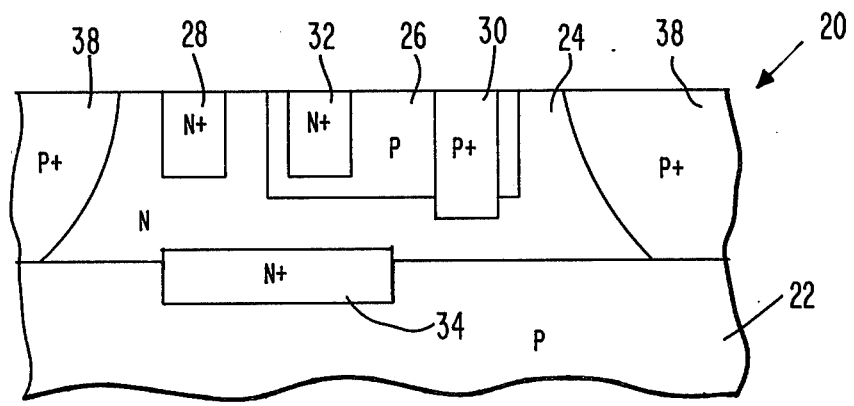
FIG. 4 is a cross-sectional view of the preferred embodiment of the device of the present invention.

Referring to FIGS. 3 and 4, top and cross-sectional views of the device 20 of the present invention, are shown. In accordance with the present invention, the device 20 is an integrated amplifying transistor of one type combined with a protective transistor of opposite type. Thus, an amplifying NPN transistor is combined with a protective PNP transistor.

In the preferred embodiment of the invention, the device 20 is formed on a semiconductor substrate 22, which is typically comprised of P type silicon. An N type epitaxial layer 24 is formed on the P type substrate 22. A portion of the epitaxial layer 24 is isolated from the balance of the epitaxial layer by a highly doped P+ type isolation region 38 which completely surrounds it.

The P+ type isolation region 38 also acts as the collector of the PNP protective transistor Q2. A P type well region 26 extends into the N type epitaxial layer 24. The P type well region 26 acts as the base of the amplifying transistor Q1 and as the emitter of the protective transistor Q2. Similarly, an N+ type region 28, which also extends into the N type epitaxial layer 24, acts as the collector of the amplifying transistor Q1 and also as the base of the protective transistor Q2. A highly doped, deep P+ type region 30 is preferably included in the device 20 in order to increase the beta of the protective transistor Q2. The P+ region 30 preferably extends through the P well 26 into the epitaxial layer 24.

A highly doped N type region 32 acts as the emitter of the amplifying transistor Q1. A highly doped N type pocket 34 extends into the P type substrate 22, between the substrate 22 and the epitaxial layer 24, and is used to decrease the resistance between the emitter and the collector of transistor Q1. The pocket 34 extends under the N type regions 28 and 32.

With particular reference to FIG. 3, the P type region 26 preferably includes a narrow region 36 (when viewed from the top). The purpose of the narrow region 36 is to provide the protective resistor, $R_P$, as shown in FIG. 2, which is not necessary to the invention, but which is highly desirable. The resistive value results from the resistance of the well material in the narrow region 36.

The manufacture of the present invention is accomplished through standard processing steps of the type well known in the art. In particular, it is an advantage of the invention that it is not necessary to alter any standard photolighography, deposition, or diffusion manufacturing steps in order to build the invention into a monolithic integrated circuit. Accordingly, those skilled in the art will understand that the present invention is manufactured by diffusing the highly doped N type region 34 into a P type silicon substrate 22. The N type pocket 34 will have a typical resistivity on the order of 40 ohms/square.

Next, an N type epitaxial layer 24, having a typical resistivity on the order of 1000 ohms/square, is grown over the surface of the P type substrate. A portion of the N type epitaxial layer, in which the invention will be formed, is isolated from the balance of the epitaxial layer by a highly doped P type isolation diffusion 38. Next, the highly doped P type base contact 30 is defined and formed. Thereafter, the P well 26 is defined and formed.

The next step in the manufacture of the device 20 is the formation of the highly doped N type regions 28, 32. These, too, are formed using standard techniques.

Finally, a protective oxide (not shown) is formed over the surface of the device, contact openings (not shown) are formed in the protective oxide, and the conductive interconnection material is applied, defined, and formed.

Those of ordinary skill in the art will recognize that the preceding steps are all accomplished using standard, well-known photolithographic deposition, diffusion, and etching techniques.

It will also be obvious to those of ordinary skill in the art that while an NPN amplifying transistor has been described in conjunction with a PNP protective transistor, by reversing the conductivity of each region shown in FIGS. 3 and 4, a PNP amplifying transistor could be manufactured with a protective NPN transistor.

I claim:

1. An integrated circuit voltage overload protection device comprising:
   (a) a semiconductor substrate of a first conductivity type;
   (b) a layer of semiconductor material of a second conductivity type overlying said substrate;
   (c) a first highly doped region of said first conductivity type, extending through said layer to said substrate and completely surrounding a portion of said layer, whereby said portion of said layer is isolated from the remainder of said layer;
   (d) first and second well regions of said first conductivity type, each well region partially extending into said isolated portion of said layer from a surface thereof, the well regions connected to each other by a narrow, highly doped region of the first conductivity type;
   (e) a second highly doped region of said second conductivity type, extending into said isolated portion of said layer from a surface thereof and separated by portions of said layer from the first well region;
   (f) a third highly doped region of said second conductivity type extending into the first well region from a surface thereof and being surrounded by portions of the first well region;
   (g) a fourth highly doped region of said first conductivity type extending through the intersection of the second well region with said layer from a surface of the second well region and being more highly doped than the second well region, said third highly doped region lying between said second highly doped region and said fourth highly doped region when viewed from said surface; and
   (h) a fifth highly doped region of said second conductivity type extending between said isolated portion of said layer and said substrate, said fifth highly doped region underlying at least said second and third highly doped regions but not underlying said fourth highly doped region.

2. The integrated circuit overload protection device of claim 1 wherein said semiconductor substrate is of P type conductivity and said fifth highly doped region does not extend under said fourth highly doped region, whereby said second highly doped region comprises the collector of an NPN transistor, said third highly doped region comprises the emitter of said NPN transistor, well region comprises the base of said NPN transistor, and said fourth highly doped region comprises the contact to said base of said NPN transistor.

3. The integrated circuit overload protection device of claim 2 wherein said fifth highly doped region extends beneath said second and third highly doped regions and only partially extends beneath the narrow, highly doped region connecting the first and second well regions.

4. An integrated circuit overload protection device comprising:
   (a) a semiconductor substrate of a first conductivity type;
   (b) a layer of semiconductor material of a second conductivity type overlying said substrate;
   (c) a first highly doped region of said first conductivity type extending through said layer to said substrate and completely surrounding a portion of said layer, whereby said portion of said layer is isolated from the remainder of said layer;

(d) a well region of said first conductivity type partially extending into said isolated portion of said layer from a surface thereof;

(e) a second highly doped region of said second conductivity type extending into said isolated portion of said layer from a surface thereof and which is separated by portions of said layer from said well region;

(f) a third highly doped region of said second conductivity type extending into said well region from a surface thereof and being surrounded by portions of said well region;

(g) a narrow portion of said well region, when viewed from the top surface of said well region, on the side of said well region away from said second highly doped region, said narrow portion extending away from the portion of said well region which contains said highly doped region; and (h) a fourth highly doped region of said second conductivity type extending between said isolated portion of said layer and said substrate, said fourth highly doped region underlying at least said second and third highly doped regions but not completely underlying said narrow portion of said well region.

5. The integrated circuit overload protection device of claim 4 further comprising a fifth highly doped region of said first conductivity type extending through the intersection of said well region with said layer from a surface of said well region and being more highly doped than said well region, said fifth highly doped region being separated from said third highly doped region, when viewed from said surface, by at least some portion of said narrow portion of said well region.

6. The integrated circuit overload protection device of claim 5 wherein said first conductivity type is P type.

* * * * *

UNITED STATES PATENT AND TRADEMARK OFFICE
CERTIFICATE OF CORRECTION

PATENT NO. : 4,463,369

DATED : July 31, 1984

INVENTOR(S) : Jack R. Harford

It is certified that error appears in the above-identified patent and that said Letters Patent is hereby corrected as shown below:

Column 2, line 23, cancel "an" (second occurrence).

Column 2, line 36, cancel "the" and instead insert --then--.

Column 4, line 48, before "well" insert --the second--.

Column 5, line 18, after "said" insert --third--.

Signed and Sealed this

Twenty-sixth Day of February 1985

[SEAL]

Attest:

DONALD J. QUIGG

Attesting Officer

Acting Commissioner of Patents and Trademarks